United States Patent [19]

Nagata et al.

[11] Patent Number: 5,225,867
[45] Date of Patent: Jul. 6, 1993

[54] CHROMATIC IMAGE RECORDING APPARATUS

[75] Inventors: Osamu Nagata, Aichi; Yoshinori Endo, Toyota; Keiji Seo, Nagoya, all of Japan

[73] Assignee: Brother Kogyo Kabushika Kaisha, Japan

[21] Appl. No.: 724,182

[22] Filed: Jul. 1, 1991

[30] Foreign Application Priority Data

Jul. 3, 1990 [JP] Japan .................. 2-176663
Jul. 3, 1990 [JP] Japan .................. 2-176664
Jul. 3, 1990 [JP] Japan .................. 2-176665
Jul. 3, 1990 [JP] Japan .................. 2-176666

[51] Int. Cl.$^5$ .................. G03B 27/80; G03B 27/52
[52] U.S. Cl. .................. 355/27; 355/38; 355/77
[58] Field of Search .................. 355/27, 35, 38, 100, 355/32, 326

[56] References Cited

U.S. PATENT DOCUMENTS 5,019,873 5/1991 Imaeda .................. 355/35 X R

FOREIGN PATENT DOCUMENTS 0118628 5/1990 Japan .................. 355/35
0199447 8/1990 Japan .................. 355/35
2237396 5/1991 United Kingdom .................. 355/35

Primary Examiner—Michael L. Gellner
Assistant Examiner—D. Rutledge
Attorney, Agent, or Firm—Oliff & Berridge

[57] ABSTRACT

A chromatic image recording apparatus comprises a gradation control member, an image reading member, a hue characteristics calculating member and a hue characteristics control member. In the chromatic image recording apparatus, the optimum exposing conditions of an original having a deviated color balance can be easily established. The output chromatic image of desired quality can be obtained, irrespective of any hue characteristics of the chromatic image on the original. When a brightness characteristics calculating member and a brightness characteristics control member replace the hue characteristics calculating member and the hue characteristics control member, the output chromatic image of desired quality can be obtained, irrespective of any brightness characteristics of the chromatic image on the original. When the chromatic image recording apparatus additionally comprises an auxiliary exposure member and an auxiliary exposure control member, the output chromatic image can be reproduced with an improved color gradation.

26 Claims, 15 Drawing Sheets

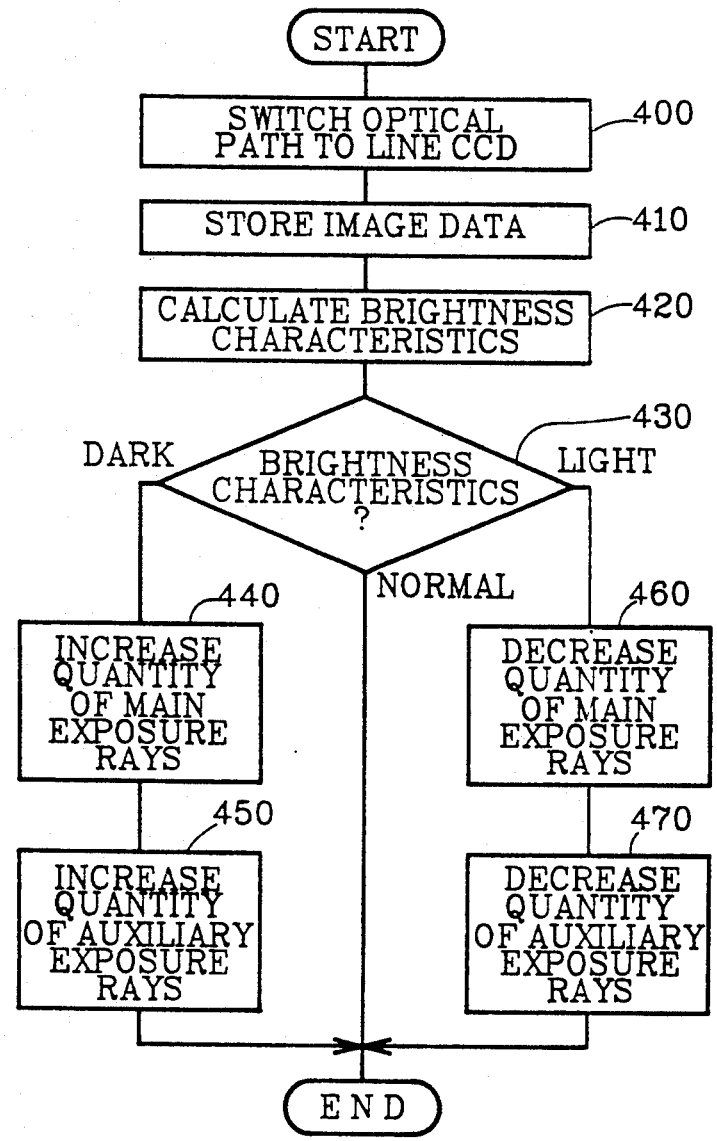

CHROMATIC IMAGE RECORDING APPARATUS

BACKGROUND OF THE INVENTION

1. Field of the Invention

This invention relates to an apparatus for recording an image on a photosensitive recording medium.

2. Description of Related Art

Conventionally, when an image recording apparatus, such as a color photocopier, copies an original, rays are irradiated onto and reflected by the original, thereby resulting in the formation of an image. Specifically, when the photosensitive recording medium, such as a photosensitive sheet, is exposed to the rays reflected by the original, a latent image corresponding to the image on the original is formed on the surface of the photosensitive recording medium. Subsequently, the surface of the photosensitive recording medium with the latent image formed thereon is put in contact under pressure with the developer applied surface of a developer sheet, and the image is transferred from the photosensitive recording medium onto the developer sheet. By heating the developer sheet, a chromatic image, corresponding to the latent image, is developed on the developer sheet.

When the component colors of the chromatic image on the original are similar to each other in pigment and brightness, for example, when the original bears the scenery of the sea mainly composed of blue, the related-art image recording apparatus obtains an output chromatic image having poor color gradation. The optimum conditions of the exposure of the original to the rays vary with the hue and brightness of the rays. Consequently, some hue characteristics of the original result in an output chromatic image of undesirable quality with poor color gradation.

The optimum conditions of the exposure of the original to the rays also vary with the brightness characteristics of the original, such as the average brightness and contrast of the original. Some brightness characteristics of the original result in an output chromatic image of undesirable quality with poor color gradation. For example, when the quantity of the rays reflected by the original is large, when the original has low brightness and when the original is inclined to white, the output chromatic image has no distinctive color gradation, even if the quantity of the reflected rays is varied. As a result, the output chromatic image becomes uniformly light and has no distinctive color gradation. The same problem arises when the original has dark color.

SUMMARY OF THE INVENTION

An object of the present invention is thus to provide a chromatic image recording apparatus that develops a chromatic image of desirable quality irrespective of the hue characteristics of an original.

Another object of the present invention is to provide a chromatic image recording apparatus that develops a chromatic image with excellent color gradation.

A further object of the present invention is to provide a chromatic image recording apparatus that develops a chromatic image of desirable quality irrespective of the brightness characteristics of the original.

The above and other related objects are realized by the chromatic image recording apparatus according to the present invention. In the chromatic image recording apparatus, a latent image is formed on the photosensitive surface of a photosensitive sheet corresponding to a chromatic image on an original. The photosensitive sheet is put under pressure in contact with a developer sheet, with the photosensitive surface of the photosensitive sheet opposing the developer applied surface of the developer sheet. The chromatic image is transferred onto the developer applied surface of the developer sheet. By heating the developer sheet, the color development is promoted, thereby forming the chromatic image.

A chromatic image recording apparatus according to the present invention, in which a latent image corresponding to a chromatic image on an original is formed on a photosensitive recording medium, the photosensitive recording medium is contacted under pressure with a developer sheet to transfer the image onto the developer sheet, and the developer sheet is heated to develop a chromatic image corresponding to the latent image and the original, comprises an exposure member for forming the latent image on the photosensitive recording medium, the exposure member emitting exposure rays to irradiate the original and reflect therefrom; an exposure control member for controlling the quantity of the exposure rays; a gradation control member for controlling the color gradation of rays reflected from the original when irradiated with the exposure rays; an image reading member for reading image data of each color grade from the chromatic image on the original based on the reflected rays; a hue characteristics calculating member for obtaining the hue characteristics of the chromatic image on the original based on the read image data; and a hue characteristics control member for controlling the exposure control member and for controlling the gradation control member based on the calculated hue characteristics.

The chromatic image recording apparatus according to the present invention further comprises an auxiliary exposure member for exposing the photosensitive recording medium before the exposure member emits the exposure rays for irradiating the original, the auxiliary exposure member emitting auxiliary exposure rays; and an auxiliary exposure control member for controlling the auxiliary exposure member and for adjusting the color balance of the auxiliary exposure rays based on the calculated hue characteristics.

A chromatic image recording apparatus according to another embodiment of the present invention, in which a latent image corresponding to a chromatic image on an original is formed on a photosensitive recording medium, the photosensitive recording medium is contacted under pressure with a developer sheet to transfer the image onto the developer sheet, and the developer sheet is heated to develop a chromatic image corresponding to the latent image and the original, comprises an exposure member for forming the latent image on the photosensitive recording medium, the exposure member emitting exposure rays to irradiate the original and reflect therefrom; an exposure control member for controlling the quantity of the exposure rays; a gradation control member for controlling the color gradation of rays reflected from the original when irradiated with the exposure rays; an image reading member for reading image data of each color grade from the chromatic image on the original based on the reflected rays; a brightness characteristics calculating member for obtaining the brightness characteristics of the chromatic image on the original based on the read image data; and a brightness characteristics control member for controlling the exposure control member and for adjusting the quantity of the exposure rays based on the calculated brightness characteristics.

A chromatic image recording apparatus according to the present invention further comprises an auxiliary exposure member for exposing the photosensitive recording medium before the exposure member emits the exposure rays for irradiating the original, the auxiliary exposure member emitting auxiliary exposure rays; and an auxiliary exposure control member for controlling the auxiliary exposure member and for adjusting the quantity of the auxiliary exposure rays based on the calculated brightness characteristics.

A process for recording a chromatic image according to the present invention comprises the steps of irradiating a chromatic image on an original with exposure rays; reading the reflected rays for image data to determine the hue characteristics of the original chromatic image; calculating the hue characteristics of the original chromatic image from the read image data; controlling the quantity of rays irradiated onto the original chromatic image according to the calculated hue characteristics; adjusting the color balance of the reflected rays according to the calculated hue characteristics; irradiating the original chromatic image with exposure rays to expose a photosensitive recording medium and form a latent image of the original chromatic image; and developing the latent image.

A process according to the present invention further comprises the step of irradiating the photosensitive recording medium with auxiliary exposure rays from an auxiliary exposure unit based on the calculated hue characteristics prior to the final step of irradiating the original chromatic image to form the latent image.

The process for recording a chromatic image according to another embodiment of the present invention comprises the steps of irradiating a chromatic image on an original with exposure rays; reading the reflected rays for image data to determine the brightness characteristics of the original chromatic image; calculating the brightness characteristics of the original chromatic image from the read image data; controlling the quantity of rays irradiated onto the original chromatic image according to the calculated brightness characteristics; irradiating the original chromatic image with exposure rays to expose a photosensitive recording medium and form a latent image of the original chromatic image; and developing the latent image.

The process according to the present invention further comprises the step of irradiating the photosensitive recording medium with auxiliary exposure rays from an auxiliary exposure unit based on the calculated brightness characteristics prior to the final step of irradiating the original chromatic image to form the latent image.

BRIEF DESCRIPTION OF THE DRAWINGS

FIG. 14 and 15 are flowcharts showing the control of the quantity of the rays for the third and fourth embodiments, respectively.

DETAILED DESCRIPTION OF PREFERRED EMBODIMENTS

Figure 1:
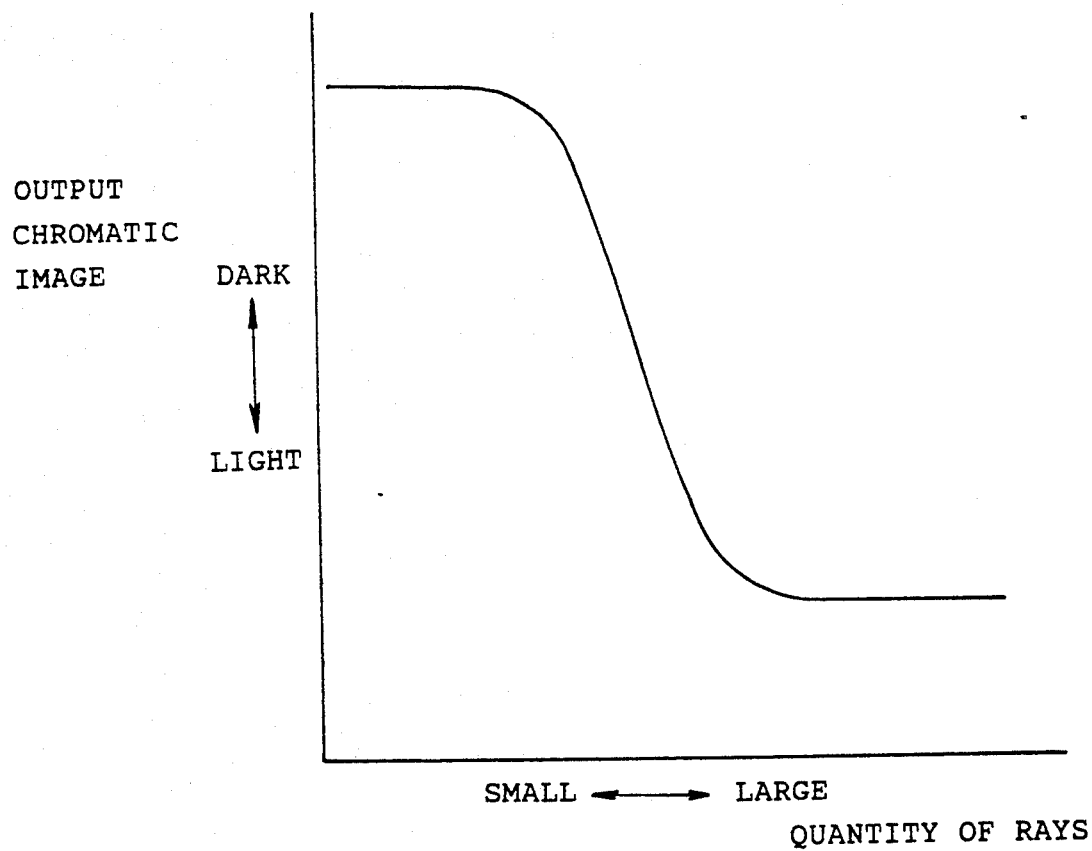
FIGS. 1 through 3 are explanatory graphs showing the relationship between the brightness of an output chromatic image and the quantity of exposure rays.

Embodiments of a chromatic image recording apparatus according to the invention are now described referring to the drawings.

The chromatic image recording apparatus has been developed, by considering the relationship between the quantity of rays reflected by the original and the brightness of the output chromatic image, as shown in FIG. 1. The quantity of the rays indicates the brightness of each color composing the original. The brightness characteristics of the original, such as the average brightness and contrast of each color component of the original, are first detected. Based on the brightness characteristics, the hue characteristics of the original is obtained. Based on the hue characteristics, each color filter element is inserted into the optical path to regulate the color balance of the exposure rays. Consequently, an excellent output chromatic image is formed.

Figure 4:
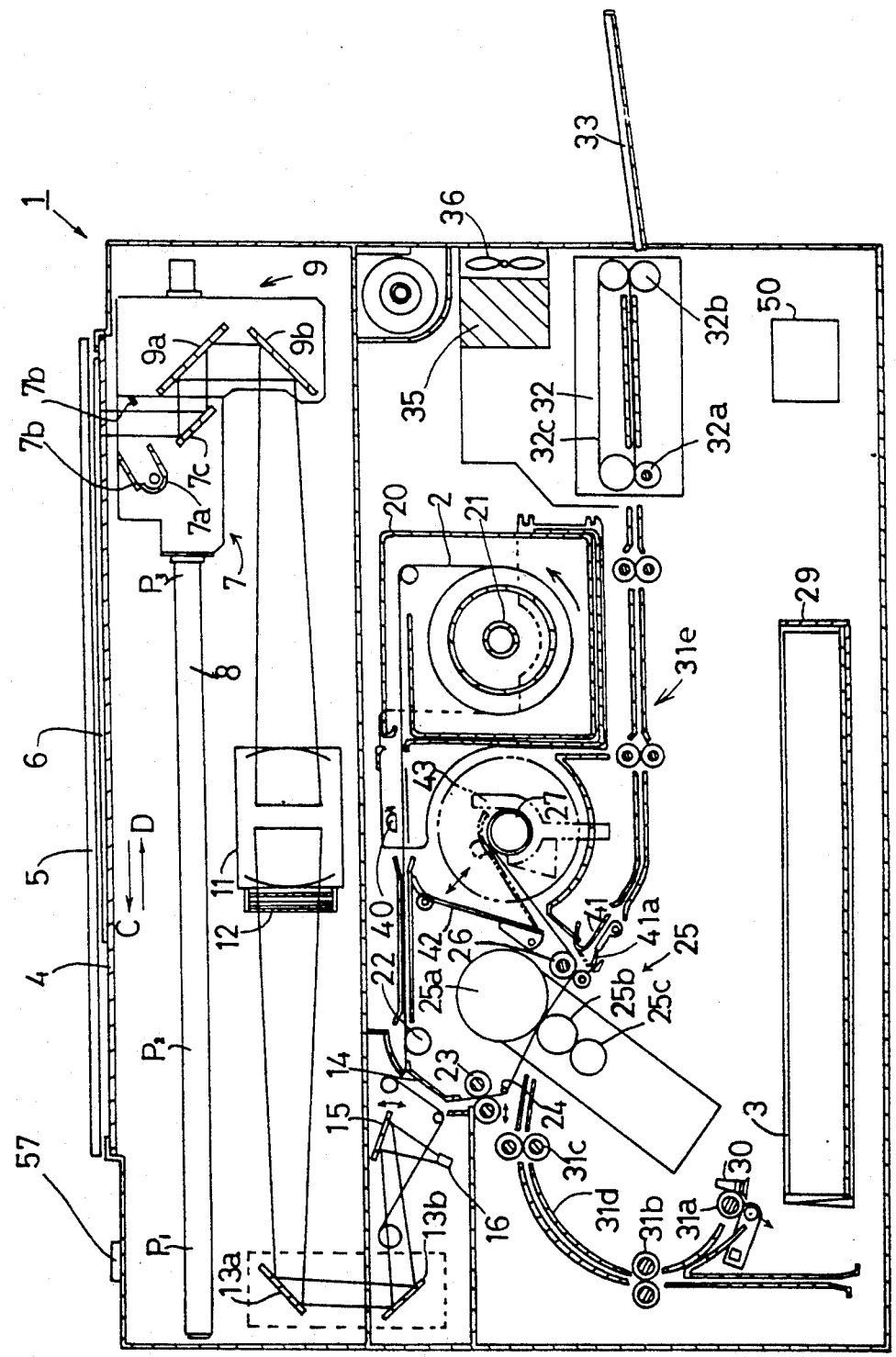
FIG. 4 is a side elevational view in partial section of a copying machine for the first and third embodiments.

In the first embodiment, as shown in FIG. 4, a copying machine 1, photosensitive and pressure sensitive, uses photosensitive paper comprising a microcapsule sheet 2 and a developer sheet 3. The microcapsule sheet 2 is a photosensitive pressure sensitive paper sheet. Numerous microcapsules are applied on the surface of the support member of the microcapsule sheet 2. The microcapsules contain dye precursor reacting to a developer described later. The developer is applied onto the surface of the support member of the developer sheet 3 and reacts to the dye precursor, thereby developing colors. The reaction of the developer with the dye precursor is not described here in detail; that is disclosed in, for example, the U.S. Pat. No. 4,399,209, hereby incorporated by reference herein.

The copying machine 1 has a glass base 4 and a cover 5 on its upper portion: the glass base 4 is transparent and the cover 5 is opaque. An original 6 is placed face down on the glass base 4 with the cover 5 open, and the cover 5 is then closed. In the upper right portion of the copying machine 1 as the figure is viewed, a light source 7 is provided such that the light source 7 can traverse in the directions as shown by arrows C and D along a shaft 8 parallel with the glass base 4. The light source 7, shown schematically in FIG. 4, comprises a halogen lamp 7a, a reflector 7b and a reflecting mirror 7c. The light source 7 sends rays in line to the glass base 4. The halogen lamp 7a is located at right angles to the direction shown by the arrows C and D. The rays sent from the light source 7 pass through the glass base 4 and are reflected by the original 6 faced down on the glass base 4. A mirror portion 9 comprising reflecting mirrors 9a and 9b is attached onto the shaft 8, separately from the light source 7. The rays reflected by the original 6 are successively reflected by the reflecting mirrors 7c, 9a and 9b, and are guided in parallel with the sliding direction of the light source 7.

Figure 9:
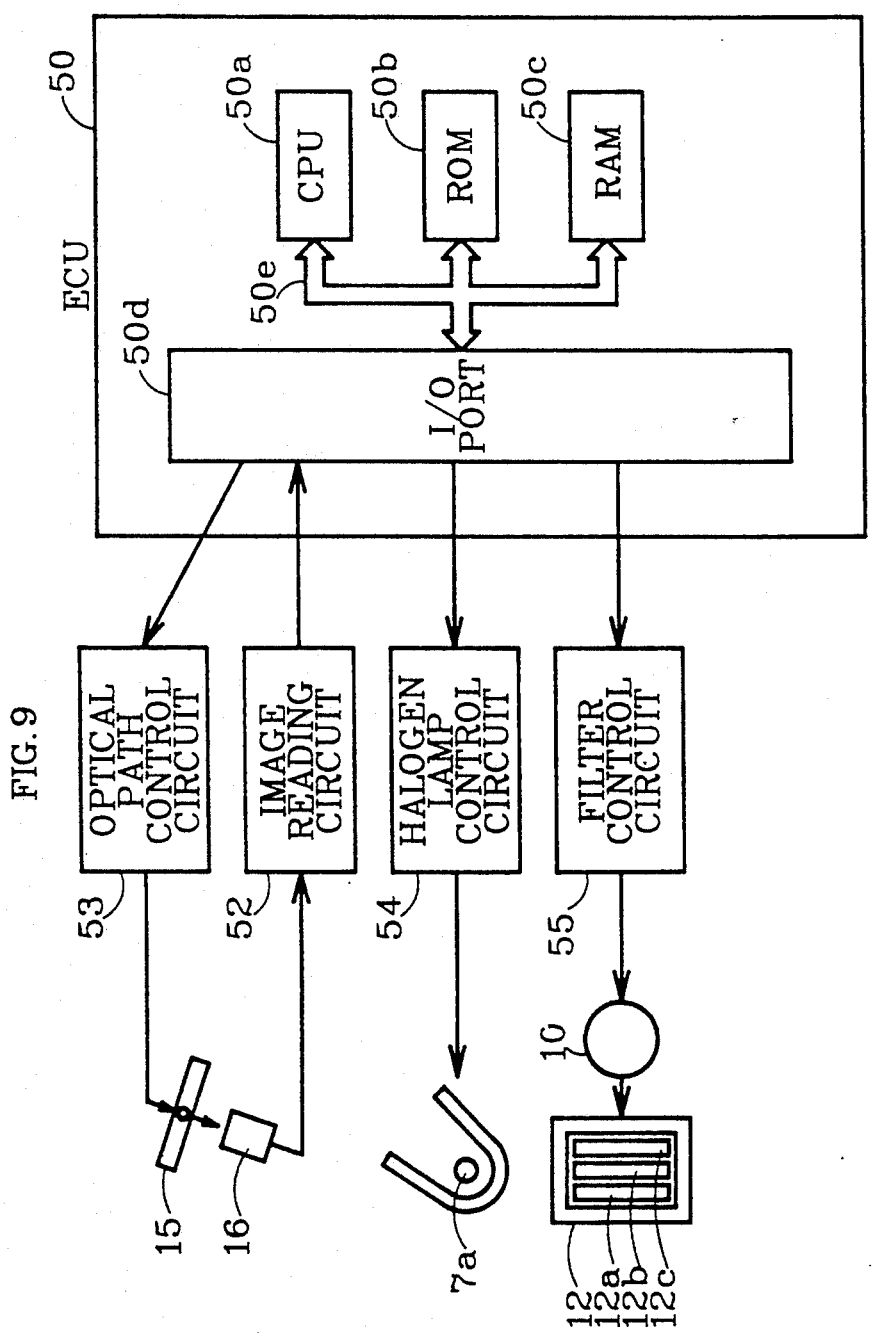
FIG. 9 is a block diagram of an electronic control unit for the first and third embodiments.

Below the glass base 4, a lens 11 is fixed. A filter 12 is adjacent to the lens 11 and controls the tone of images photocopied. The rays, reflected by the reflecting mirror 9b, pass through the lens 11 and are then reflected by reflecting mirrors 13a and 13b. As shown in FIG. 9, the filter 12 comprises a yellow filter 12a, a magenta filter 12b and a cyanic filter 12c. The yellow, magenta and cyanic filters 12a, 12b, 12c are moved vertically through a not-shown rack and pinion by a pulse motor 10. By the combination of the color filters in the filter 12, the color correction of red, green and blue is carried out. Specifically, when the yellow filter 12a and the magenta filter 12b are used, the filter 12 absorbs green and blue rays, and develops red. When the yellow filter 12a and the cyanic filter 12c are used, the filter 12 absorbs red and blue rays, and develops green. When the cyanic filter 12c and the magenta filter 12b are used, the filter 12 absorbs red and green rays, and develops blue.

An exposure stand 14 is provided at the right of the reflecting mirror 13b, as the figure is viewed, and exposes the microcapsule sheet 2. A reflecting mirror 15 is rotatably attached between the reflecting mirror 13b and the exposure stand 14 such that the reflecting mirror 15 switches the optical path of the rays by rotating. A line charge coupled device 16 (referred to as the line CCD 16 hereinafter) is provided below the reflecting mirror 15, for reading the image of the original 6. The reflected rays are irradiated onto the microcapsule sheet 2 along the exposure stand 14 by adjusting the optical path with the reflecting mirror 15, thereby forming a latent image on the microcapsule sheet 2. The reflecting mirrors 13a and 13b are usually fixed, but slidably provided. When the latent image to be formed on the microcapsule sheet 2 is enlarged or reduced, the reflecting mirrors 13a and 13b together slid in a direction parallel to the shaft 8 to adjust the position thereof. An optical path length is thus altered according to a projection magnification m.

A cartridge 20 having a shaft 21 is detachably provided towards the middle of the copying machine 1. The microcapsule sheet 2 is wound around the shaft 21 and held in the cartridge 20.

As seen in FIG. 4, below the exposure stand 14, a feed roller 22, conveying rollers 23 and a tension control roller 24 are provided. A pressure developing unit 25 is provided at the right of the tension control roller 24, as the figure is viewed, and comprises a large pressure roller 25a, a small pressure roller 25b and a backup roller 25c. At the right of the pressure developing unit 25, separation rollers 26 are provided for separating the microcapsule sheet 2 and the developer sheet 3 which are fed closely together through the pressure developing unit 25. A takeup shaft 27 is placed between the separation rollers 26 and the cartridge 20, for winding up and holding the microcapsule sheet 2. The microcapsule sheet 2 is drawn out from the cartridge 20 past the feed roller 22, is passed above the exposure stand 14 through conveying rollers 23 and the tension control roller 24, and is fed through the pressure developing unit 25. The microcapsule sheet 2 then passes through the separation rollers 26 and is wound up onto the takeup shaft 27. The microcapsule sheet 2, thus drawn out from the cartridge 20, is protected from exposure by a shielding cover.

A developer sheet cassette 29 for accommodating the developer sheets 3 is provided below the pressure developing unit 25. An acetabulum-like sheet sucking unit 30, above the developer sheet cassette 29, attracts the developer sheets 3 using negative pressure. The developer sheets 3 are drawn out one by one from the developer sheet cassette by the sheet sucking unit 30. Each of the developer sheets 3 is attracted by the sheet sucking unit 30, and is fed through feed rollers 31a, 31b and 31c, and feed guides 31d into the pressure developing unit 25.

A thermal fixing unit 32 is provided after or to the right of the pressure developing unit 25, as the figure is viewed. The thermal fixing unit 32 comprises a heat roller 32a, a discharge roller 32b and a conveying belt 32c. A sheet tray 33 is provided to the right of the thermal fixing unit 32, and receives the developer sheet 3 which has been developed. A deodorizing filter 35 and a fan 36 are provided above the thermal fixing unit 32. The deodorizing filter 35 deodorizes the gas generated during the thermal fixing, and the fan 36 introduces the gas into the deodorizing filter 35.

The copying machine 1 is provided with an automatic loading function, by which the microcapsule sheet 2 is automatically set into the given passage of the copying machine 1. A not-shown leading film portion is attached to the leading end of the microcapsule sheet 2. The leading film portion is automatically drawn out of the cartridge 20, conveyed and wound up around the takeup shaft 27. The microcapsule sheet 2 is thus automatically set in the copying machine 1. The automatic loading function includes an arc-shaped roller 40 between the cartridge 20 and the feed roller 22, for drawing the leading film portion of the microcapsule sheet 2. A separation chute 41 is rotatably attached adjacent to the separation rollers 26, for guiding the leading film portion of the microcapsule sheet 2 onto the takeup shaft 27. Upper and lower takeup guides 42 and 43 are provided around the takeup shaft 27, for assisting winding the leading film portion of the microcapsule sheet 2 onto the takeup shaft 27. Takeup guide 42 is pivotal, as shown in FIG. 4.

An electronic control unit 50 (referred to as the ECU 50 hereinafter) for controlling the copying machine 1 is now explained referring to FIG. 9. The ECU 50 comprises a known CPU 50a, ROM 50b, RAM 50c and I/O port 50d, which are connected to one another by a bus line 50e. The CPU 50a carries out computation, determination and other processing. The ROM 50b stores in advance the quantity of rays emitted from the halogen lamp 7a, the degree of insertion into the optical path of the filter 12 for correcting the hue characteristic, and other data. The RAM 50c reads and stores the image data from the line CCD 16. The image data is transferred through the I/O port 50d between the ECU 50 and the circuits connected to the ECU 50. The ECU 50 is connected to an image reading circuit 52 for receiving the image data from the line CCD 16, and an optical path control circuit 53 for rotating the reflecting mirror 15 to change the direction thereof. The ECU 50 is also connected to a halogen lamp control circuit 54 for controlling the quantity of rays by regulating the voltage of the halogen lamp 7a, and a filter control circuit 55 for driving the pulse motor 10 to move the yellow, magenta and cyanic filters 12a, 12b, 12c.

The operation of the copying machine 1 is explained below with reference to FIG. 4. After the cartridge 20 is set into the copying machine 1, the automatic loading of the microcapsule sheet 2 is started. Specifically, the arc-shaped roller 40 rotates at least once in the direction in which the leading film portion attached at the leading end of the microcapsule sheet 2 is fed to the conveying rollers 23. After the arc-shaped roller 40 stops rotating, the conveying rollers 23 convey the leading film portion. During the automatic loading of the microcapsule sheet 2, the upper and lower takeup guides 42, 43 and the separation chute 41 rotate to be positioned as shown by the dotted lines in FIG. 4. Specifically, the takeup guide 42 pivots downwardly toward the takeup shaft 27, and a gate 41a in the separation chute 41 closes. After the leading film portion of the microcapsule sheet 2 is wound around the takeup shaft 27, the upper and lower takeup guides 42, 43 and the gate 41a of the separation chute 41 return to the original position thereof shown by a solid line in FIG. 4, thereby preparing for the photocopying.

When a start key 57, shown schematically in FIG. 4, is pressed, the chromatic image on the original 6 is scanned three times in total, so as to determine the hue characteristics of red, green and blue rays, respectively. Specifically, the yellow, magenta and cyanic filters 12a, 12b and 12c are controlled to be inserted into the optical path, so that red, green and blue are developed to determine the strength of the hue characteristics of each color. While each color is developed, the light source 7 is shifted from a position P1 past a position P2 to a position P3, irradiating the rays onto the original 6. While the rays are irradiated onto the original 6, the reflecting mirror 15 is rotated to reflect the rays onto the line CCD 16. For example, the chromatic image on the original 6 is irradiated with red rays, read by the line CCD 16, and stored into the RAM 50c of the ECU 50. The chromatic image irradiated with green and blue rays is likewise read and stored into the RAM 50c.

After the original 6 is scanned three times and the light source 7 reaches the position P3, the original 6 is again scanned, so that the microcapsule sheet 2 is exposed. Specifically, the filter 12 is moved to the specified position according to the hue characteristics of the chromatic image on the original 6, so as to adjust the color balance of the rays through the filter 12. Subsequently, the sliding direction of the light source 7 is changed. Specifically, the light source 7 slides from the position P3 past P2 to P1, irradiating the rays onto the chromatic image on the original 6 at the same time. The reflecting mirror 15 is rotated to switch the optical path toward the exposure stand 14, which exposes the microcapsule sheet 2. A latent image is formed on the microcapsule sheet 2, corresponding to the chromatic image on the original 6.

When the feed speed of the microcapsule sheet 2 is V and the projecting magnification is m, the reflecting mirror 7c and the halogen lamp 7a shift at the shift speed of $(1/m)V$, and the reflecting mirrors 9a and 9b shift at the shift speed of $(\frac{1}{2}m)V$. The feed speed of the microcapsule sheet 2 is synchronized with the shift speed of the reflecting mirrors 7c, 9a and 9b. Consequently, while the microcapsule sheet 2 passes the exposure stand 14, the latent image is successively formed onto the microcapsule sheet 2, corresponding to each line of the chromatic image of the original 6. The feed speed V is predetermined based on the specified projecting magnification m.

The top of the developer sheets 3 accommodated in the developer sheet cassette 29 is first fed through the sheet sucking unit 30, the feed rollers 31a, 31b, 31c, and the feed guide 31d, and closely contacts the microcapsule sheet 2. The developer sheet 3 and the microcapsule sheet 2 are fed together into the pressure developing unit 25. In the pressure developing unit 25, the developer sheet 3 and the microcapsule sheet 2 are pressed between the large pressure roller 25a and the small pressure roller 25b while the microcapsule applied surface, which bears the latent image formed, of the microcapsule sheet is in contact with the developer applied surface of the developer sheet 3. The unexposed microcapsules are ruptured under pressure, and the internal chromogenic composition is transferred to the developer sheet 3 to form the chromatic image on the developer sheet 3.

The microcapsule sheet 2 and the developer sheet 3 drawn out from the pressure developing unit 25 are transported and separated by the separation rollers 26, sending the microcapsule sheet 2 upwards and the developer sheet 3 ahead through feed corridor 31e. The thermal fixing unit 32 promotes the color development of the developer sheet 3 and eventually the chromatic image is formed on the developer sheet 3. The developer sheet 3 facing upward is then discharged by the discharge roller 32 onto the sheet tray 33. On the other hand, the microcapsule sheet 2 passes through the separation rollers 26, and is wound up onto the takeup shaft 27.

Figure 12:
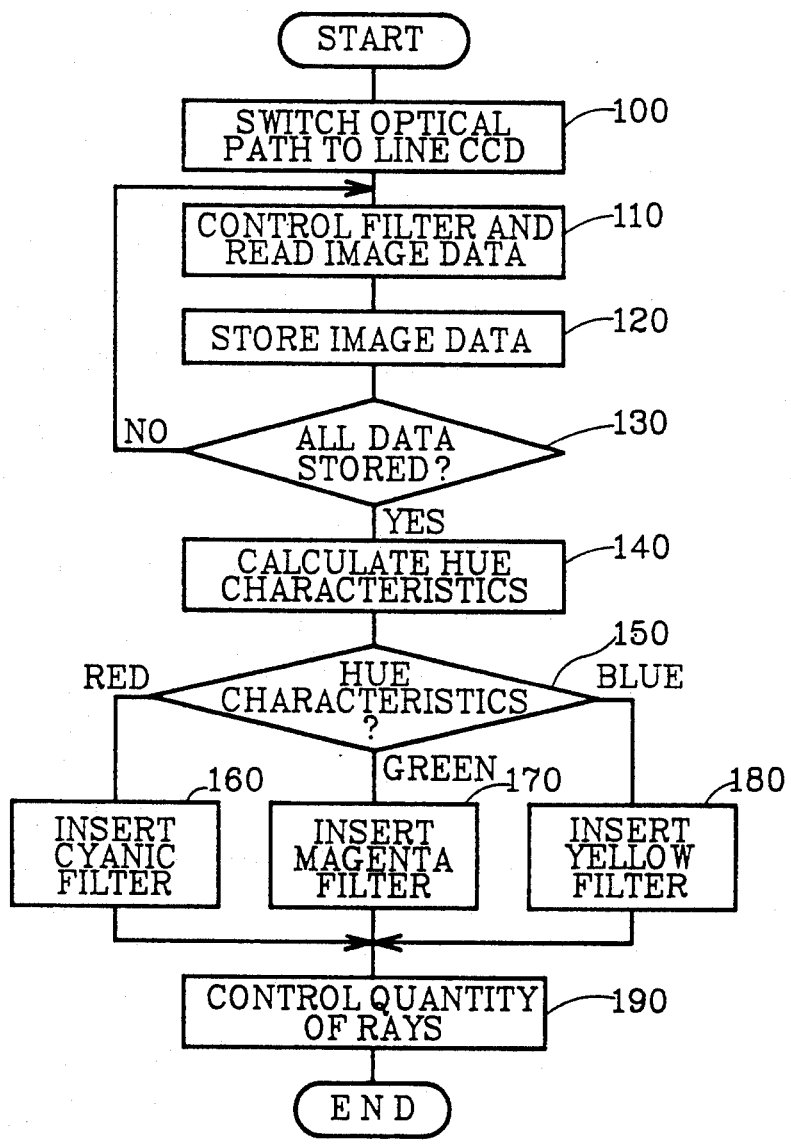
FIG. 12 and 13 are flowcharts showing the control of color balance for the first and second embodiments, respectively.

The control of the color balance of the rays accompanying the operation of the copying machine 1 is now explained referring to FIGS. 9 and 12. As shown in the flowchart of FIG. 12, after the start key 57 is pressed, at step 100 the optical path is switched toward the line CCD 16 by driving the optical path control circuit 53 and rotating the reflecting mirror 15. Subsequently, at step 110 the filter 12 is controlled and the image data of each color ray is read. For example, when the hue characteristics of a red ray are detected, the pulse motor 10 is driven so that the yellow and magenta filters 12a and 12b are inserted into the optical path and the cyanic filter 12c is removed from the optical path. At step 120 the image data is successively stored into the RAM 50c. Specifically, the light source 7 is slid, thereby scanning the original 6 once. The image reading circuit 52 is driven, and the image is successively read from the line CCD 16 and stored into the RAM 50c. Subsequently, it is determined at step 130 whether all the image data of red, green and blue is stored into the RAM 50c. When the determination at step 130 is negative, the process step goes back to step 110. When all the image data is stored into the RAM 50c and the determination is positive, the process step goes to step 140. At step 140 the hue characteristics of the chromatic image on the original 6 are calculated using the image data stored in the RAM 50c.

Subsequently, at step 150 the hue characteristics calculated at step 140 are compared with the base data of the hue characteristics prestored in the ROM 50b, thereby determining the hue of the chromatic image on the original 6. When step 150 determines that the chromatic image is inclined to red by some degree as compared by the base data, step 160 inserts the cyanic filter 12c a specified amount into the optical path and removes the yellow and magenta filters 12a and 12b a specified amount from the optical path, thereby decreasing a red light component by the degree to which the image was inclined to red. In the same way, when step 150 determines that the chromatic image is inclined to green by some degree as compared by the base data, step 170 inserts the magenta filter 12b a specified amount into the optical path and removes the yellow and cyanic filters 12a and 12c a specified amount from the optical path, thereby decreasing a green light component by the degree to which the image was inclined to green. When step 150 determines that the chromatic image is inclined to blue by some degree as compared by the base data, step 180 inserts the yellow filter 12a a specified amount into the optical path and removes the magenta and cyanic filters 12b and 12c a specified amount from the optical path, thereby decreasing a blue light component by the degree to which the image was inclined to blue. At steps 160, 170 and 180, the color balance of the ray is adjusted by driving the filter 12.

Subsequently, at step 190, the quantity of the exposure rays is controlled based on the brightness of the whole chromatic image on the original 6. The brightness of the chromatic image is determined based on the image data stored in the RAM 50c. The halogen lamp control circuit 54 is driven, thereby increasing or decreasing the voltage applied onto the halogen lamp 7a. The quantity of the exposure rays is thus increased or decreased by the specified quantity stored in the ROM 50b. After controlling the quantity of the exposure rays at step 190, the process steps end.

After controlling the filter 12 and the quantity of the exposure rays according to the hue and brightness characteristics of the chromatic image on the original 6, the microcapsule sheet 2 is exposed.

As aforementioned, in the first embodiment, the original 6 is scanned with red, green and blue rays, respectively, by sliding the light source 7; the chromatic image on the original 6 is read; and the image data of each color ray is stored into the RAM 50c. The stored image data is compared with the base data stored in the ROM 50b in advance, thereby determining the hue characteristics of an output chromatic image. Based on such hue characteristics, the filter 12 is controlled to regulate the color balance of the exposure rays, before the microcapsule sheet 2 is exposed.

Consequently, according to the hue characteristics of the original 6, the optimum exposing conditions can be established easily by selecting the filter 12 to control from the yellow, magenta and cyanic filters 12a, 12b and 12c and adjusting the quantity of the movement of the filter 12. Thus, an output chromatic image of desirable quality can be easily obtained.

Figure 2:
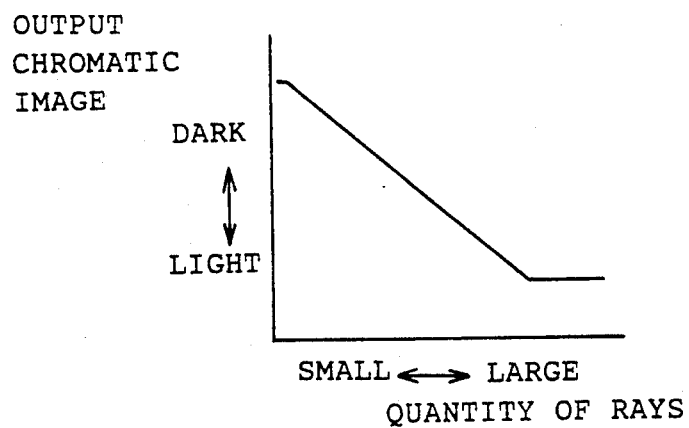

This chromatic image recording apparatus has been developed, by considering the relationship between the quantity of the exposure rays and the gradation of the output chromatic image. Based on the hue characteristics of the original obtained by the hue characteristics calculating member, the color balance of the auxiliary exposure rays emitted by the auxiliary exposure member, thereby forming the output chromatic image provided with an excellent color gradation. For example, when the original is composed of dark red, the quantity of reflected red rays is small. As shown in the first flat portion of the graph in FIG. 1, when the quantity of the rays is small, the brightness of the output chromatic image indicates no change, even if the quantity of the reflected rays varies. As a result, the output chromatic image becomes red uniformly with low gradation. The output chromatic image is thus flat and reproduces the gradation of the original imprecisely. To reproduce the gradation of the original precisely, the color balance of the rays emitted from the auxiliary exposure member is regulated and the quantity of the red rays is increased. By varying the quantity of the rays in this way, as shown in FIG. 2, the output chromatic image has the color gradation proportional to the quantity of the rays.

The second embodiment is explained referring to FIGS. 5, 7, 10 and 13. The second embodiment is similar to the first embodiment, except that main and auxiliary filters are provided to control the color balance of the exposure rays. Therefore, the components in the second embodiment that are the same as those in the first embodiment are referred to by using the numbers identical to those of the corresponding components in the first embodiment. For the sake of simplicity, different portions of the second embodiment are now described below.

Figure 5:
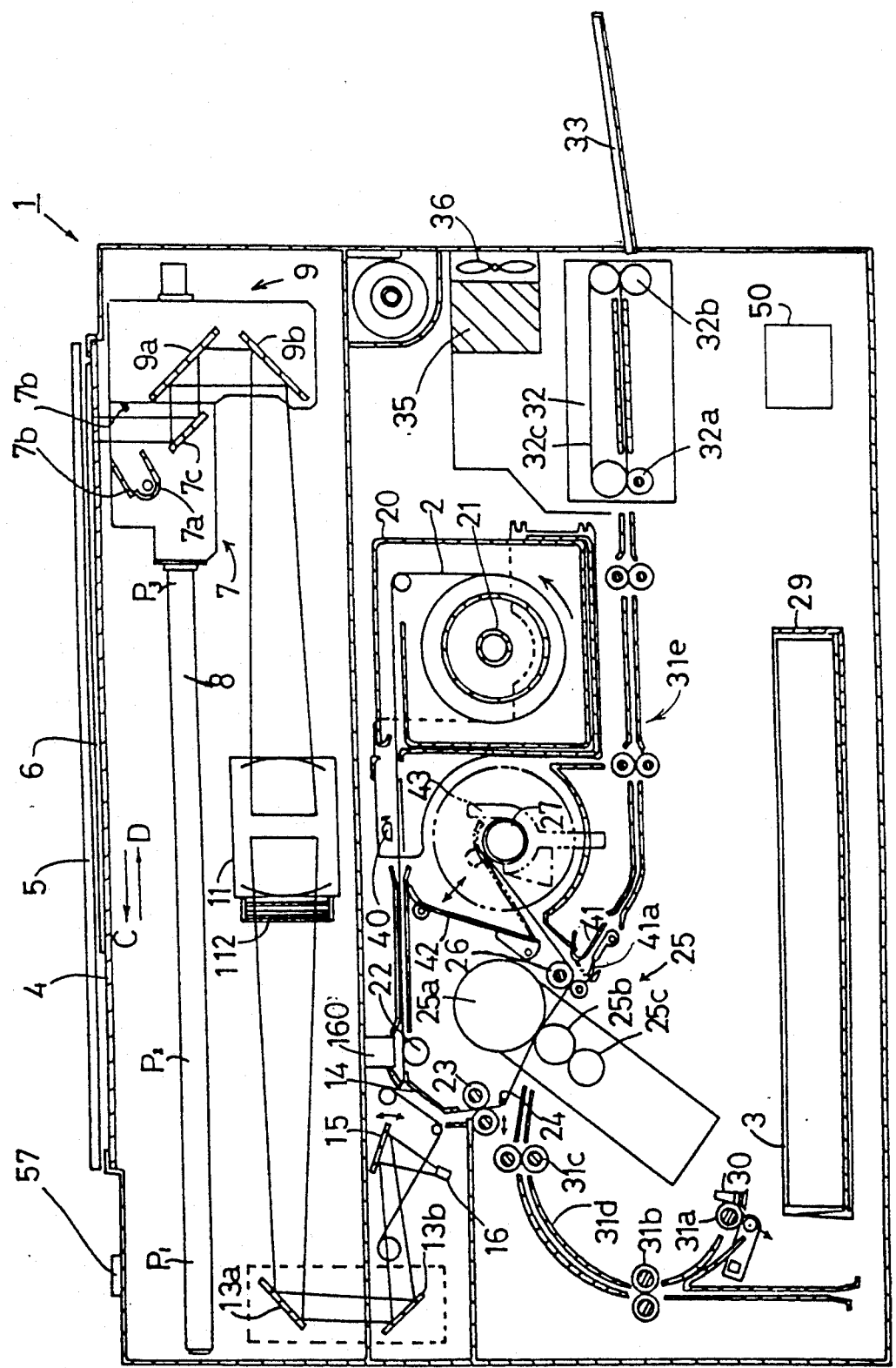
FIGS. 5 and 6 are side elevational views in partial section of the copying machine for the second and fourth embodiments, respectively.
Figure 7:
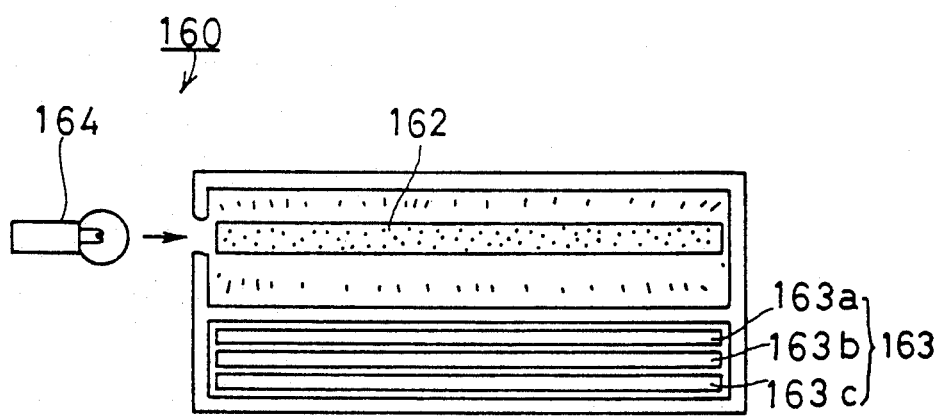
FIGS. 7 and 8 are schematic views of an auxiliary exposure unit for the second and fourth embodiments, respectively.
Figure 10:
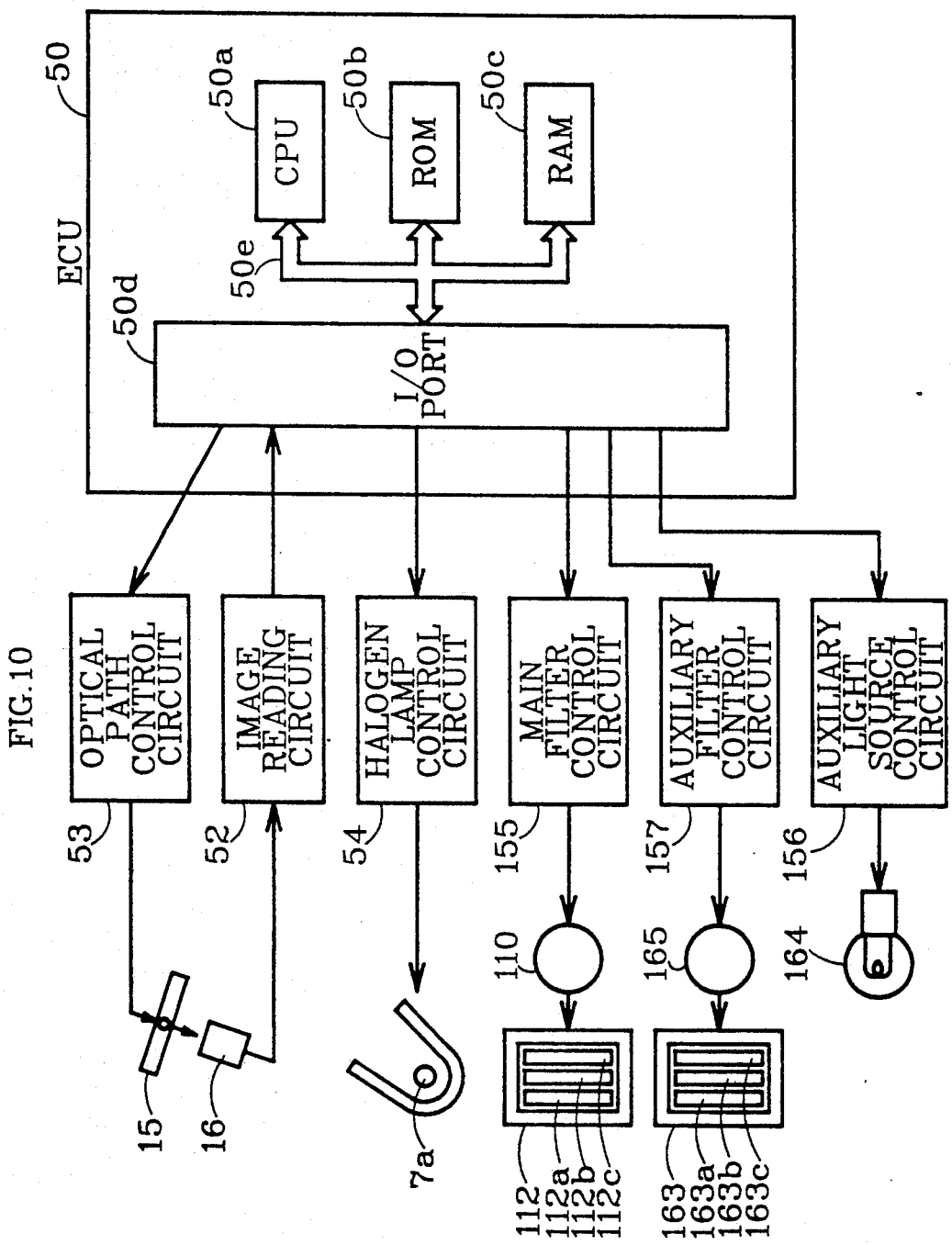
FIGS. 10 and 11 are block diagrams of an electronic control unit for the second and fourth embodiments, respectively.

As shown in FIG. 5, a main filter 112 is provided adjacent to the lens 11. As shown in FIG. 10, the main filter 112 comprises yellow, magenta and cyanic filters 112a, 112b and 112c. Main exposure of the microcapsule sheet 2 is carried out by the exposure stand 14. In addition to the main filter 112, an auxiliary exposure unit 160 is provided above the feed roller 22 as seen in FIG. 5. The auxiliary exposure unit 160 exposes the microcapsule sheet 2 with a small quantity of rays, before the main exposure by the main filter 112. As shown in FIG. 7, the auxiliary exposure unit 160 comprises an optical fiber 162, an auxiliary filter 163 and an auxiliary light source 164 for supplying the rays to the optical fiber 162. Since the optical fiber 162 is slightly scratched, a small quantity of rays emanate from the optical fiber 162. The auxiliary filter 163 comprises yellow, magenta and cyanic filters 163a, 163b and 163c. As shown in FIG. 10, the auxiliary exposure unit 162 also comprises an auxiliary pulse motor 165 for driving the yellow, magenta and cyanic filters 163a, 163b and 163c.

In the second embodiment, as shown in FIG. 10, different from the first embodiment, the ECU 50 is connected to a main filter control circuit 155 for controlling the main filter 112. The ECU 50 is additionally connected to an auxiliary filter control circuit 157 for controlling the auxiliary exposure unit 160, and an auxiliary light source control circuit 156 for supplying rays to the auxiliary light source 164 of the auxiliary exposure unit 160. In the ECU 50, the ROM 50b stores the quantity of main exposure rays from the halogen lamp 7a, the quantity of the movement of the main and auxiliary filters 112 and 163, and other control data. The quantity of main exposure rays from the halogen lamp 7a is controlled by the halogen lamp control circuit 54. The main filter control unit 155 controls the pulse motor 10 thereby moving the yellow, magenta and cyanic filters 112a, 112b and 112c for main exposure. The auxiliary filter control circuit 157 drives the auxiliary pulse motor 165, thereby moving the yellow, magenta and cyanic filters 163a, 163b and 163c. The auxiliary light source control circuit 156 controls the voltage applied to the auxiliary light source 164, thereby controlling the quantity of auxiliary exposure rays.

The operation of the copying machine 1 for the second embodiment is similar to that for the first embodiment, except that the auxiliary exposure precedes the main exposure. After the original 6 is scanned three times and the light source 7 reaches the position P3, the microcapsule sheet 2 is exposed to auxiliary and main exposure rays. Specifically, the main filter 112 and the auxiliary filter 163 are moved to the specified position. Subsequently, the sliding direction of the light source 7 is changed, and the light source 7 slides from the position P3 past P2 to P1. The auxiliary and main exposure of the microcapsule sheet 2 is successively carried out. Specifically, while the microcapsule sheet 2 is being fed to the exposure stand 14, the auxiliary exposure unit 160 irradiates a small quantity of rays and exposes the microcapsule sheet 2 with the rays. The microcapsule sheet 2 on the exposure stand 14 is exposed to the rays reflected by the original 6, for the main exposure. Consequently, a latent image is formed on the microcapsule sheet 2, corresponding to the chromatic image on the original 6.

Figure 13:
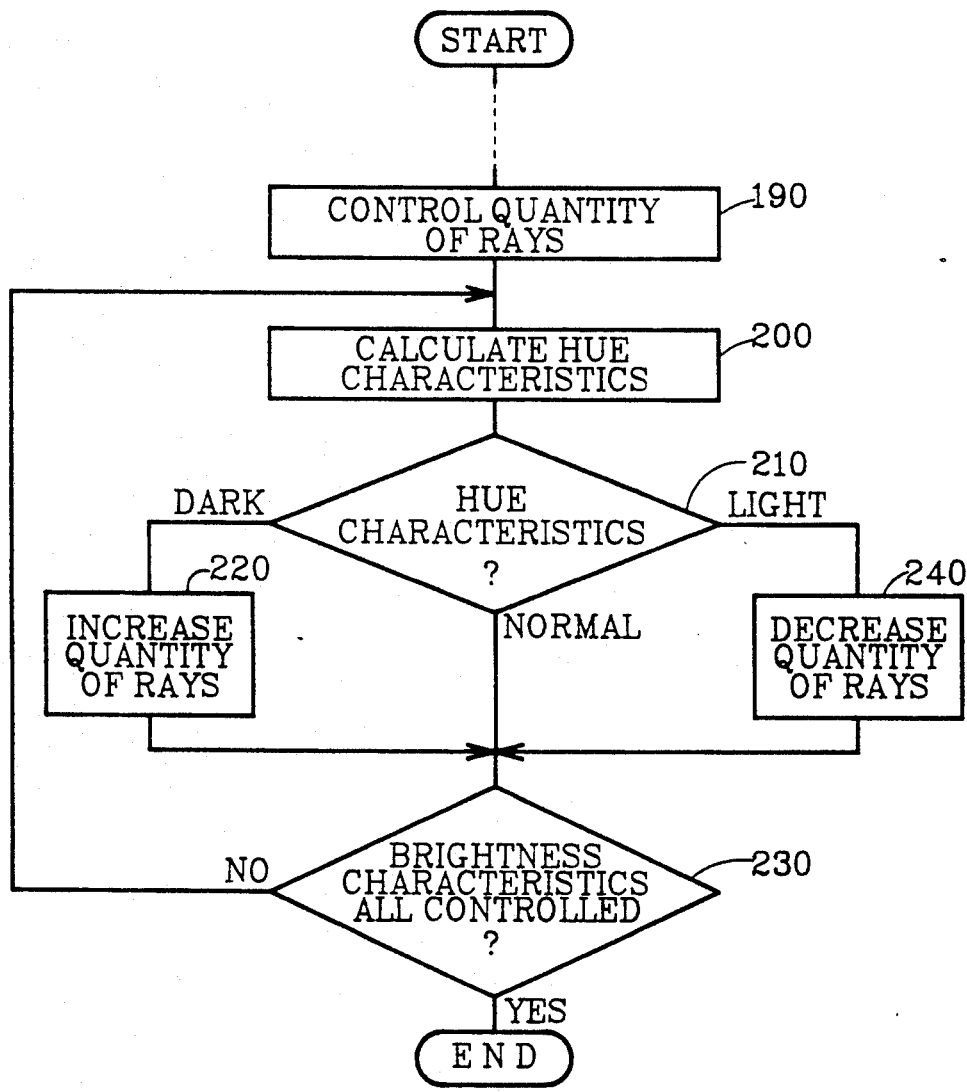

The control of the color balance of the main and auxiliary exposure rays is now explained referring to FIG. 10 and the flowchart of FIG. 13. The control of the color balance of the main exposure rays in the second embodiment is the same as the control in the first embodiment shown by the flowchart of FIG. 12. Therefore, steps 100 through 190 are omitted from the description of the second embodiment as well as the flowchart of FIG. 13 for the sake of simplicity. Only the control of the color balance of the auxiliary exposure rays is explained below. After step 190 for controlling the quantity of the main exposure rays, at step 200 the hue characteristics of each color ray are calculated based on the image data stored in the RAM 50c. Subsequently, at step 210 the strength of the hues of the chromatic image on the original 6 in each color is determined. Specifically, the hue characteristics calculated at step 200 are compared with the base data of the hue characteristics prestored in the ROM 50b. When step 210 determines that the hue of red used for the chromatic image is dark and the quantity of the reflected rays is small, step 220 increases the quantity of the red ray by the specified quantity of the auxiliary exposure rays stored in the ROM 50b, thereby improving the gradation of red. Specifically, the ECU 50 drives the auxiliary pulse motor 65 through the auxiliary filter control circuit 57, thereby moving the yellow, magenta and cyanic filters 163a, 163b and 163c, respectively, into or from the optical path a specified amount. After the quantity of the red auxiliary exposure rays is thus increased, the process step goes to step 230.

On the other hand, when step 210 determines that the brightness of red used for the chromatic image is light and the quantity of the reflected rays is large, step 240 decreases the quantity of the red ray by the specified quantity of the auxiliary exposure rays stored in the ROM 50b. Specifically, the ECU 50 drives the auxiliary pulse motor 65 through the auxiliary filter control circuit 57. The cyanic filter 163c is inserted into from the optical path the specified amount, and the yellow and magenta filters 163a and 163b are removed from the optical path the specified amount. After the quantity of the red auxiliary exposure rays is thus decreased, the process step goes to step 230.

when step 210 determines that the brightness of red used for the chromatic image is normal, the process step goes to step 230.

Subsequently, it is determined at step 230 whether the brightness characteristics of red, green and blue used for the chromatic image on the original 6 are all controlled. When the determination at step 230 is negative, the process step goes back to step 200. When the brightness characteristics have been controlled, the process steps once end.

In the second embodiment, based on the hue characteristics detected and determined as aforementioned, the main and auxiliary filters 112 and 163 are controlled, thereby regulating the color balance and gradation of an output chromatic image. According to the hue characteristics of the original 6, the optimum exposing conditions can be established easily by selecting the kind of the main and auxiliary filters 112 and 163 to move and adjusting the quantity of the movement of the selected kind of the main and auxiliary filters 112 and 163. Thus, an output chromatic image of desirable quality having an improved color gradation can be obtained.

Figure 3:
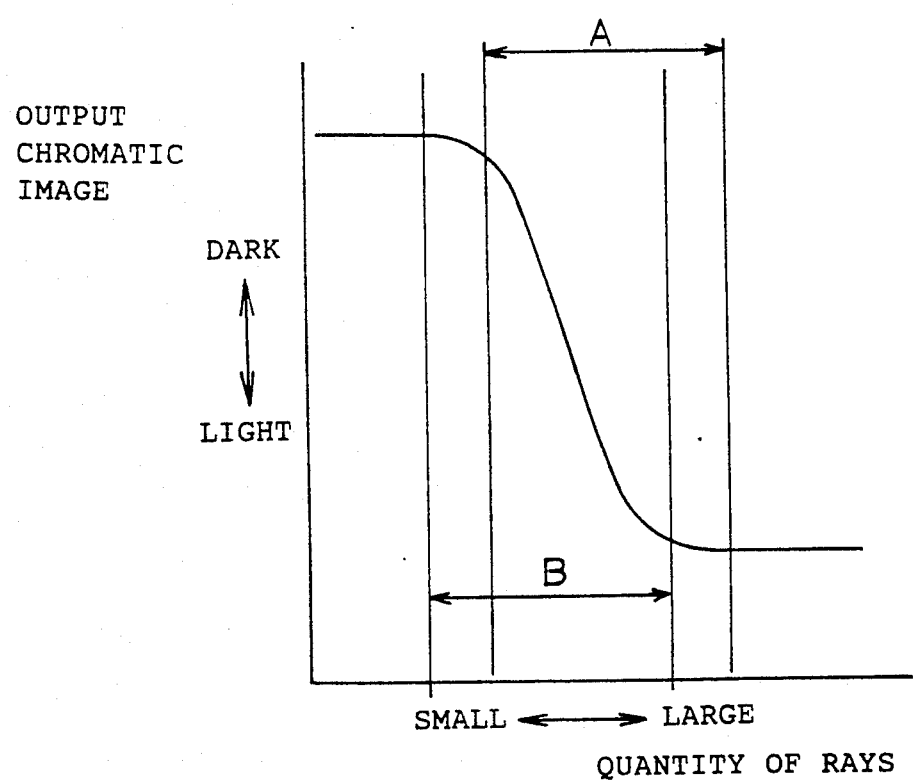

The chromatic image recording apparatus has been developed, by considering the relationship between the quantity of rays reflected by the original and the brightness of the output chromatic image, as shown in FIG. 3. The brightness characteristics of the original, such as the average brightness and contrast of the original, are first detected. Based on the brightness characteristics, the quantity of the rays is controlled, thereby developing the excellent output chromatic image. For example, when the original is white, the quantity of the rays reflected by the original increases. When the quantity of the rays increases, however, the output chromatic image becomes white. To avoid too white output chromatic image, by decreasing the quantity of the reflected rays, as shown in FIG. 3, the relationship in use for the output of the chromatic image between the brightness of the output chromatic image and the quantity of the reflected rays is shifted from the region A to the region B. An excellent output chromatic image is thus formed.

The third embodiment is now explained referring to FIGS. 3, 4, 9 and 14: the third embodiment is the same as the first embodiment in its structure. Different from the first embodiment, in the third embodiment the brightness characteristics are controlled. Therefore, the components in the third embodiment that are the same as those in the first embodiment are referred to by using the numbers identical to those of the components in the first embodiment. For the sake of simplicity, different portions of the third embodiment are described below.

In the third embodiment, when a start key 57 in FIG. 4 is pressed, the chromatic image on the original 6 is scanned once, so as to determine the brightness characteristics of the original image. Specifically, the light source 7 is shifted from the position P1 past P2 to P3, concurrently irradiating the rays onto the original 6. While the rays are irradiated onto the original 6, the reflecting mirror 15 is rotated to reflect the rays onto the line CCD 16. The chromatic image on the original 6 is read by the line CCD 16, and stored into the RAM 50c of the ECU 50.

After the original 6 is scanned and the light source 7 reaches the position P3, the original 6 is again scanned, so that the microcapsule sheet 2 is exposed. The sliding direction of the light source 7 is changed: the light source 7 slides from the position P3 past P2 to P1, concurrently irradiating the rays onto the chromatic image on the original 6. The reflecting mirror 15 is rotated to switch the optical path toward the exposure stand 14, which exposes the microcapsule sheet 2. A latent image is formed on the microcapsule sheet 2, corresponding to the chromatic image on the original 6.

Figure 14:
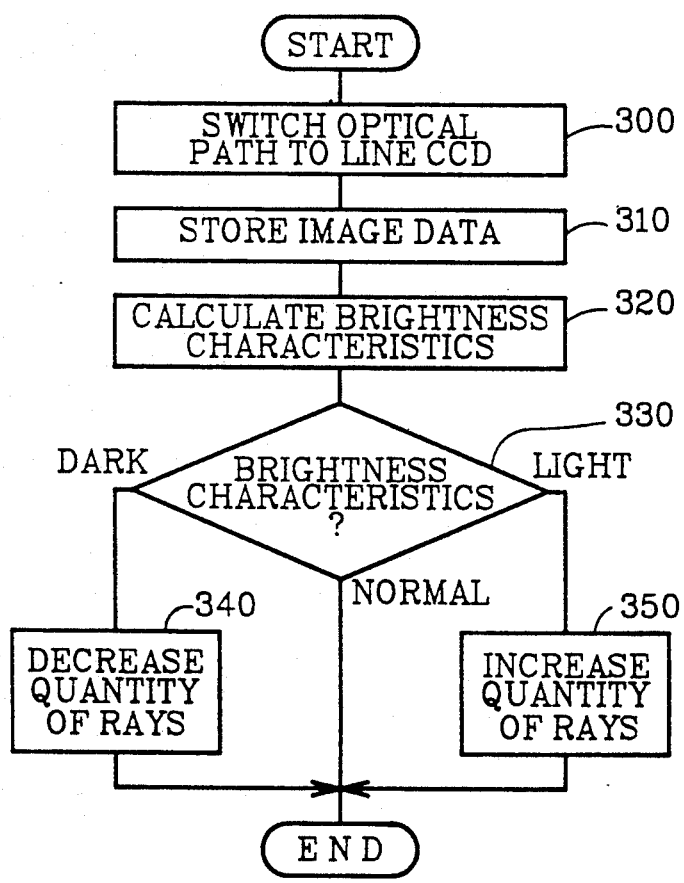

The control of the quantity of the exposure rays accompanying the operation of the copying machine 1 is now explained referring to FIGS. 9 and 14. As shown in FIG. 4, the block diagram of FIG. 9 and the flowchart of FIG. 14, after the start key 57 is pressed, at step 300 the optical path is switched toward the line CCD 16 by driving the optical path control circuit 53 and rotating the reflecting mirror 15 toward the line CCD 16. Subsequently, at step 310 the image data is successively stored into the RAM 50c. Specifically, the light source 7 is slid, thereby scanning the original 6 once. The image reading circuit 52 is driven, and the image is successively read from the line CCD 16 and stored into the RAM 50c. At step 320 the brightness characteristics of the chromatic image on the original 6 are calculated using the image data stored in the RAM 50c.

Subsequently, at step 330 the brightness characteristics calculated at step 320 are compared with the base data of the brightness characteristics prestored in the ROM 50b, thereby determining the brightness, contrast or other characteristics of the chromatic image on the original 6. When step 330 determines that the chromatic image is white and has high brightness, step 340 decreases the quantity of the exposure rays and uses the steep graphic portion B in FIG. 3 for exposure. The halogen lamp control circuit 54 is driven to decrease the voltage applied onto the halogen lamp 7a. The quantity of the exposure rays is accordingly decreased by the specified quantity stored in the ROM 50b.

When step 330 determines that the chromatic image is black and has low brightness, step 350 increases the quantity of the exposure rays and uses the graphic portion A in FIG. 3 for exposure. The halogen lamp control circuit 54 increases the voltage applied onto the halogen lamp 7a. The quantity of the exposure rays is accordingly increased by the specified quantity stored in the ROM 50b. After controlling the quantity of the exposure rays at steps 340 and 350, the process steps end.

On the other hand, when step 330 determines that the chromatic image has normal brightness, the process step end without controlling the quantity of the exposure rays.

After controlling the quantity of the exposure rays according to the brightness characteristics of the chromatic image on the original 6, the microcapsule sheet 2 is exposed.

This chromatic image recording apparatus has been developed, by considering the relationship between the quantity of the reflected rays plus auxiliary exposure rays and the gradation of the output chromatic image, as shown in FIG. 1. Based on the brightness characteristics of the original, such as the average brightness and the contrast of the original, the quantity of the rays emitted by the auxiliary exposure member is determined, thereby forming the output chromatic image provided with an excellent color gradation. For example, when the original is black, the quantity of the reflected rays is small. As shown in the first flat portion of the graph in FIG. 1, when the quantity of the reflected rays is small, the brightness of the output chromatic image indicates no change, even if the quantity of the reflected rays varies. As a result, the output chromatic image becomes black uniformly with low gradation. The output chromatic image is thus flat and reproduces the gradation of the original imprecisely. To reproduce the gradation of the original precisely, the quantity of the rays emitted from the auxiliary exposure member is increased. By varying the quantity of the rays in this way, as shown in FIG. 2, the output chromatic image has the color gradation proportional to the quantity of the rays.

The fourth embodiment is now explained referring to FIGS. 6, 8, 11 and 15: the fourth embodiment is similar to the first embodiment. Therefore, the components in the fourth embodiment the same as the first embodiment are referred to by using the numbers identical to those of the corresponding components in the first embodiment. For the sake of simplicity, different portions of the fourth embodiment are now described below.

Figure 6:
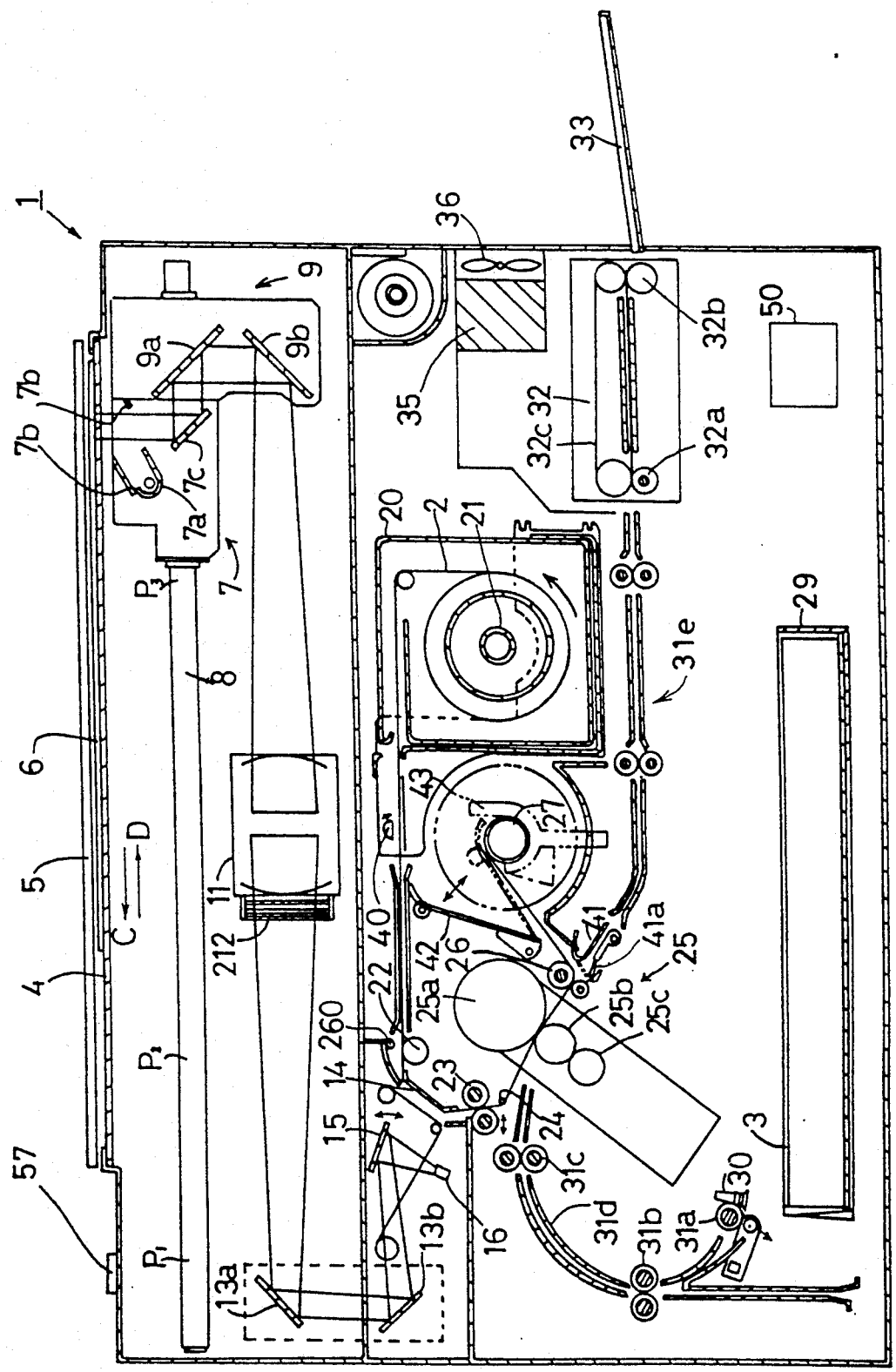
Figure 8:
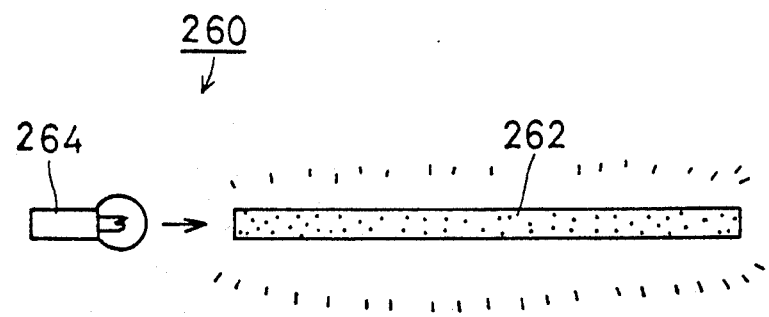
Figure 11:
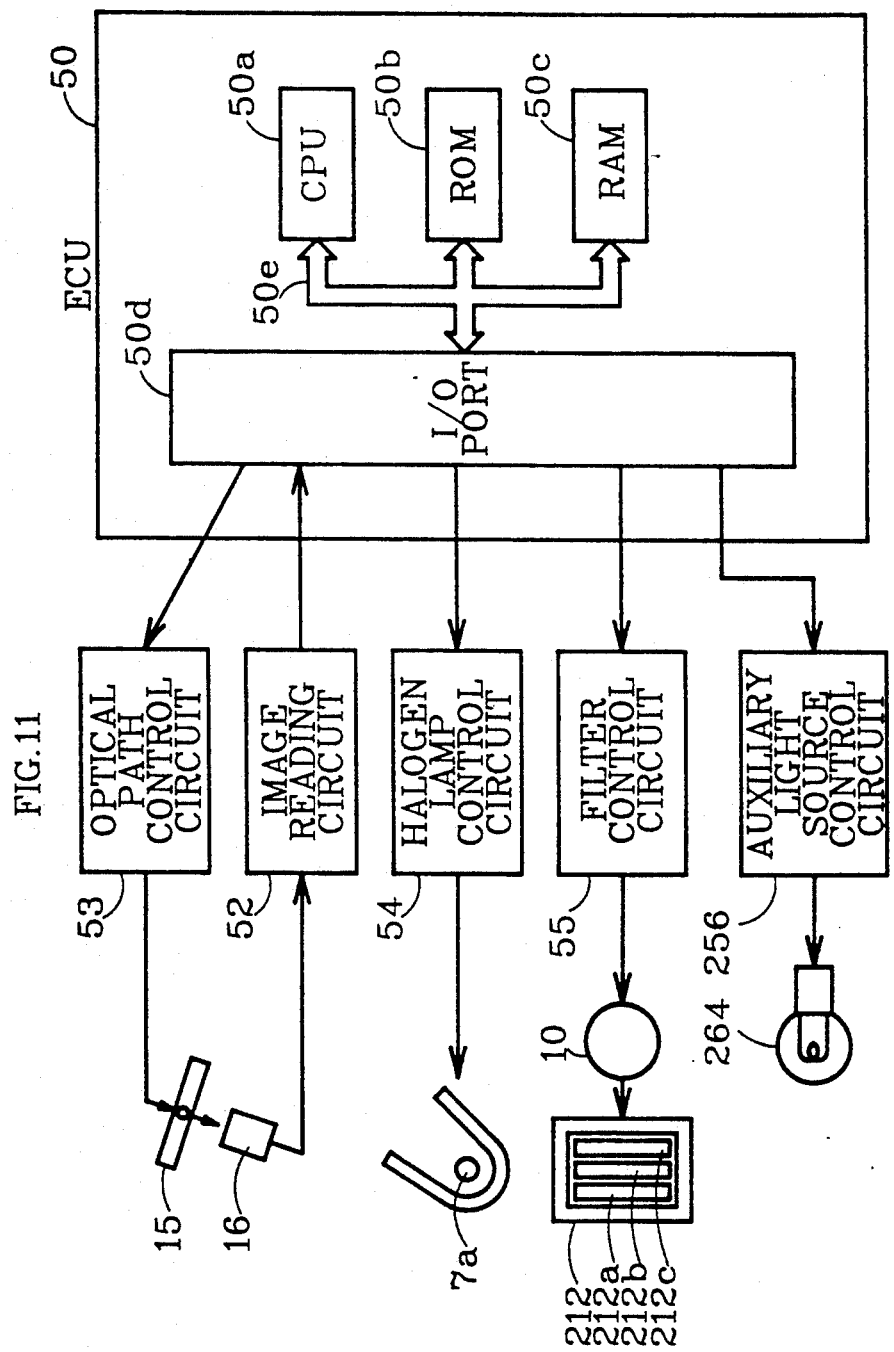

As shown in FIG. 6, a main filter 212 is provided adjacent to the lens 11. As shown in FIG. 11, the main filter 212 comprises yellow, magenta and cyanic filters 212a, 212b and 212c. Main exposure of the microcapsule sheet 2 is carried out by the exposure stand 14. In the same way as the second embodiment, an auxiliary exposure unit 260 is provided above the feed roller 22. The auxiliary exposure unit 260 exposes the microcapsule sheet 2 with a small quantity of rays, before the main exposure by the main filter 212. As shown in FIG. 8, the auxiliary exposure unit 260 comprises an optical fiber 262 and an auxiliary light source 264 for supplying the rays to the optical fiber 262. Since the optical fiber 262 is slightly scratched, a small quantity of rays leaks from the optical fiber 262. By controlling the voltage applied to the auxiliary light source 264, the supply of the rays from the auxiliary light source 264 is adjusted.

In the fourth embodiment, as shown in FIG. 11, different from the first embodiment, the ECU 50 is additionally connected to an auxiliary light source control circuit 256. The auxiliary light source control circuit 256 controls the quantity of the rays supplied to the auxiliary light source 264 of the auxiliary exposure unit 260, by controlling the voltage applied to the auxiliary light source 264. In the ECU 50, the ROM 50b stores the quantity of main exposure rays from the halogen lamp 7a, the quantity of auxiliary exposure rays from the auxiliary light source 264, the quantity of the movement of the main filter 212, and other control data.

The operation of the copying machine 1 for the fourth embodiment is similar to that for the first embodiment, except in that the original 6 is scanned once to determine the brightness characteristics of the original chromatic image and the auxiliary exposure precedes the main exposure. In the fourth embodiment, when a start key 57 in FIG. 6 is pressed, the chromatic image on the original 6 is scanned once, so as to determine the brightness characteristics of the original chromatic image. Specifically, the light source 7 is shifted from the position P1 past P2 to P3, concurrently irradiating the rays onto the original 6. While the rays are irradiated onto the original 6, the reflecting mirror 15 is rotated to reflect the rays onto the line CCD 16. The chromatic image on the original 6 is read by the line CCD 16, and stored into the RAM 50c of the ECU 50.

After the original 6 is scanned once and the light source 7 reaches the position P3, the microcapsule sheet 2 is exposed to auxiliary and main exposure rays. The sliding direction of the light source 7 is changed: the light source 7 slides from the position P3 past P2 to P1. The auxiliary and main exposure of the microcapsule sheet 2 is successively carried out. Specifically, while the microcapsule sheet 2 is being fed to the exposure stand 14, the auxiliary exposure unit 260 irradiates a small quantity of rays and exposes the microcapsule sheet 2 with the rays. The microcapsule sheet 2 on the exposure stand 14 is exposed to the rays reflected by the original 6, for the main exposure. Consequently, a latent image is formed on the microcapsule sheet 2, corresponding to the chromatic image on the original 6.

The control of the quantity of the main and auxiliary exposure rays is now explained referring to FIG. 11 and the flowchart of FIG. 15. As shown in the flowchart of FIG. 15, after the start key 57 is pressed, at step 400 the optical path is switched toward the line CCD 16 by driving the optical path control circuit 53 and rotating the reflecting mirror 15 toward the line CCD 16. Subsequently, at step 410 the image data is successively stored into the RAM 50c. Specifically, the light source 7 is slided, thereby scanning the original 6 once. The image reading circuit 52 is driven, and the image is successively read from the line CCD 16 and stored into the RAM 50c. At step 420 the brightness characteristics of the chromatic image on the original 6 are calculated using the image data stored in the RAM 50c.

Subsequently, at step 430 the brightness characteristics calculated at step 420 is compared with the base data of the brightness characteristics prestored in the ROM 50b, thereby determining the brightness, contrast or other characteristics of the chromatic image on the original 6.

When step 430 determines that the chromatic image is black and has low brightness, step 440 increases the quantity of the main exposure rays. The halogen lamp control circuit 54 increases the voltage applied onto the halogen lamp 7a. The quantity of the main exposure rays is accordingly increased by the specified quantity stored in the ROM 50b. Subsequently, at step 450 the quantity of the auxiliary exposure rays is increased by the specified quantity stored in the ROM 50b. Specifically, the ECU 50 drives the auxiliary light source control circuit 256. The auxiliary light source control circuit 256 increases the voltage applied to the auxiliary light source 264. After the quantity of the auxiliary exposure rays is increased, the process steps end.

When step 430 determines that the chromatic image is white and has high brightness, step 460 decreases the quantity of main exposure rays. The halogen lamp control circuit 54 is driven to decrease the voltage applied onto the halogen lamp 7a. The quantity of the main exposure rays is accordingly decreased by the specified quantity stored in the ROM 50b. Subsequently, at step 470 the quantity of the auxiliary exposure rays is decreased by the specified quantity stored in the ROM 50b. Specifically, the ECU 50 drives the auxiliary light source control circuit 256. The auxiliary light source control circuit 256 decreases the voltage applied to the auxiliary light source 264. After the quantity of the auxiliary exposure rays is decreased, the process steps end.

When step 430 determines that chromatic image has normal brightness, the process steps end without controlling the quantity of the main and auxiliary exposure rays.

After the quantity of the main and auxiliary exposure rays is controlled according to the brightness characteristics of the chromatic image on the original 6, the microcapsule sheet 2 is fed toward the exposure stand 14 for the auxiliary and main exposure.

As aforementioned, in the third and fourth embodiments, the original 6 is scanned with rays, by sliding the light source 7, the chromatic image on the original 6 is read, and the image data is stored into the RAM 50c. The stored image data is compared with the base data stored in the ROM 50b in advance, thereby determining the brightness characteristics of an output chromatic image. Based on such brightness characteristics, the quantity of the exposure rays is controlled, before the microcapsule sheet 2 is exposed.

Consequently, even when the original 6 has the brightness characteristics different from the normal characteristics, the optimum exposing conditions can be established easily by increasing or decreasing the quantity of the exposure rays emitted from the halogen lamp 7a. The output chromatic image of desirable quality is accordingly obtained. Further in the fourth embodiment, when the brightness characteristics of the chromatic image on the original 6 are deviated much from the normal characteristics, the chromatic image formed after the main exposure can be improved in its gradation by increasing or decreasing the quantity of the rays emitted from the auxiliary light source 264.

In this spirit, it should also be noted that in the embodiments as shown and described, the copying machine 1 for photocopying the original 6 is operated. A slide film could be photocopied. The invention could be applied to a printer using a cathode ray tube (CRT), a laser or other exposure unit. The RAM 50c need not store all the image data, and the RAM 50c could store only the hue characteristics of the image, or only the brightness characteristics of the image. In the fourth embodiment, the explanation of steps 440 and 450 precedes that of steps 460 and 470. The steps 460 and 470 could be carried out either before or after the steps 440 and 450. The steps 440, 450, 460 and 470, however, must precede the substantial exposure of the microcapsule sheet 2.

This invention has been described above with reference to the preferred embodiments as shown in the drawings. Modifications and alterations may become apparent to one skilled in the art upon reading and understanding the specification. Despite the use of the embodiments for illustration purposes, however, it is intended to include all such modifications and alterations within the scope and spirit of the appended claims.

What is claimed is:

1. A chromatic image recording apparatus in which a latent image corresponding to a chromatic image on an original is formed on a photosensitive recording medium, the photosensitive recording medium is contacted under pressure with a developer sheet to transfer the image onto the developer sheet, and the developer sheet is heated to develop a chromatic image corresponding to the latent image and the original, the apparatus comprising:
   an exposure means for forming the latent image on the photosensitive recording medium, said exposure means emitting exposure rays to irradiate the original and reflect therefrom;
   an exposure control means for controlling the quantity of said exposure rays;
   a gradation control means for controlling the color gradation of rays reflected from the original when irradiated with said exposure rays;
   an image reading means for reading image data of each color grade from the chromatic image on the original based on said reflected rays;
   a hue characteristics calculating means for obtaining the hue characteristics of the chromatic image on the original based on said read image data; and
   a hue characteristics control means for controlling said exposure control means and for controlling said gradation control means based on said calculated hue characteristics.

2. A chromatic image recording apparatus according to claim 1, wherein said image reading means is a line charge coupled device.

3. A chromatic image recording apparatus according to claim 1, wherein said gradation control means includes a filter means having a yellow, magenta and cyanic filter, each independently movable.

4. A chromatic image recording apparatus according to claim 1, further comprising:
   an auxiliary exposure means for exposing the photosensitive recording medium before said exposure means emits said exposure rays for irradiating the original, said auxiliary exposure means emitting auxiliary exposure rays; and an auxiliary exposure control means for controlling said auxiliary exposure means and for adjusting the color balance of said auxiliary exposure rays based on said calculated hue characteristics.

5. A chromatic image recording apparatus according to claim 4, wherein said auxiliary exposure means comprises:
an optical fiber,
an auxiliary light source for supplying said auxiliary exposure rays to said optical fiber; and
an auxiliary filter means disposed adjacent said optical fiber for filtering said auxiliary exposure rays emitted from said optical fiber.

6. A chromatic image recording apparatus according to claim 5, wherein said auxiliary filter means comprises a yellow, magenta and cyanic filter, each independently movable.

7. A chromatic image recording apparatus in which a latent image corresponding to a chromatic image on an original is formed on a photosensitive recording medium, the photosensitive recording medium is contacted under pressure with a developer sheet to transfer the image onto the developer sheet, and the developer sheet is heated to develop a chromatic image corresponding to the latent image and the original, the apparatus comprising:
an exposure means for forming the latent image on the photosensitive recording medium, said exposure means emitting exposure rays to irradiate the original and reflect therefrom;
an exposure control means for controlling the quantity of said exposure rays;
a gradation control means for controlling the color gradation of rays reflected from the original when irradiated with said exposure rays;
an image reading means for reading image data of each color grade from the chromatic image on the original based on said reflected rays;
a brightness characteristics calculating means for obtaining the brightness characteristics of the chromatic image on the original based on said read image data; and
a brightness characteristics control means for controlling said exposure control means and for adjusting the quantity of said exposure rays based on said calculated brightness characteristics.

8. A chromatic image recording apparatus according to claim 7, wherein said image reading means is a line charge coupled device.

9. A chromatic image recording apparatus according to claim 7, wherein said gradation control means includes a filter means having a yellow, magenta and cyanic filter, each independently movable.

10. A chromatic image recording apparatus according to claim 7, further comprising:
an auxiliary exposure means for exposing the photosensitive recording medium before said exposure means emits said exposure rays for irradiating the original, said auxiliary exposure means emitting auxiliary exposure rays; and
an auxiliary exposure control means for controlling said auxiliary exposure means and for adjusting the quantity of said auxiliary exposure rays based on said calculated brightness characteristics.

11. A chromatic image recording apparatus according to claim 10, wherein said auxiliary exposure means comprises:
an optical fiber and an auxiliary light source for supplying rays to said optical fiber.

12. A chromatic image recording apparatus according to claim 10, wherein said auxiliary exposure control means comprises means for controlling voltage to said auxiliary exposure means.

13. A process for recording a chromatic image, comprising the steps of:
irradiating a chromatic image on an original with exposure rays in an optical path;
reading the reflected rays for image data to determine the hue characteristics of the original chromatic image;
calculating the hue characteristics of the original chromatic image from the read image data;
controlling the quantity of rays irradiated onto the original chromatic image according to the calculated hue characteristics;
adjusting the color balance of the reflected rays according to the calculated hue characteristics;
irradiating the original chromatic image with exposure rays to expose a photosensitive recording medium and form a latent image of the original chromatic image; and
developing the latent image.

14. A process according to claim 13, further comprising:
adjusting the optical path before the final step of irradiating the original chromatic image with exposure rays to expose the photosensitive recording medium.

15. A process according to claim 13, wherein the step of calculating the hue characteristics includes comparing the read image data to stored base data.

16. A process according to claim 13, wherein the step of controlling the quantity of rays includes increasing or decreasing the voltage applied to a lamp for emitting exposure rays.

17. A process according to claim 13, wherein the step of adjusting the color balance includes selectively inserting color filters in the optical path.

18. A process according to claim 13, wherein before reading the reflected rays, the process comprises the step of selectively inserting color filters in the optical path to provide base data for each color ray.

19. A process according to claim 13, wherein prior to the final step of irradiating the original chromatic image to form the latent image, the process comprises the step of:
irradiating the photosensitive recording medium with auxiliary exposure rays from an auxiliary exposure unit based on the calculated hue characteristics.

20. A process according to claim 19, wherein subsequent to the step of reading the reflected rays for image data and prior to developing the latent image, the process comprises:
adjusting the auxiliary exposure rays according to the calculated hue characteristics; and
irradiating the photosensitive recording medium with the adjusted auxiliary exposure rays.

21. A process for recording a chromatic image, comprising the steps of:
irradiating a chromatic image on an original with exposure rays in an optical path;

reading the reflected rays for image data to determine the brightness characteristics of the original chromatic image;

calculating the brightness characteristics of the original chromatic image from the read image data;

controlling the quantity of rays irradiated onto the original chromatic image according to the calculated brightness characteristics;

irradiating the original chromatic image with exposure rays to expose a photosensitive recording medium and form a latent image of the original chromatic image; and developing the latent image.

22. A process according to claim 21, further comprising:

adjusting the optical path before the final step of irradiating the original chromatic image with exposure rays to expose the photosensitive recording medium.

23. A process according to claim 21, wherein the step of calculating the brightness characteristics includes comparing the read image data to stored base data.

24. A process according to claim 21, wherein the step of controlling the quantity of rays includes increasing or decreasing the voltage applied to a lamp for emitting exposure rays.

25. A process according to claim 21, wherein prior to the final step of irradiating the original chromatic image to form the latent image, the process comprises the step of:

irradiating the photosensitive recording medium with auxiliary exposure rays from an auxiliary exposure unit based on the calculated brightness characteristics.

26. A process according to claim 25, wherein subsequent to the step of reading the reflected rays for image data and prior to developing the latent image, the process comprises:

adjusting the quantity of auxiliary exposure rays according to the calculated brightness characteristics; and irradiating the photosensitive recording medium with the adjusted auxiliary exposure rays.

* * * * *